(12) United States Patent
Ohno et al.

(10) Patent No.: US 9,864,111 B2
(45) Date of Patent: Jan. 9, 2018

(54) OPTICAL ELEMENT AND OPTICAL DEVICE

(71) Applicant: KABUSHIKI KAISHA TOSHIBA, Tokyo (JP)

(72) Inventors: Hiroshi Ohno, Kanagawa (JP); Kazushige Yamamoto, Kanagawa (JP); Soichiro Shibasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 284 days.

(21) Appl. No.: 14/514,985

(22) Filed: Oct. 15, 2014

(65) Prior Publication Data
US 2015/0140263 A1    May 21, 2015

(30) Foreign Application Priority Data
Nov. 20, 2013 (JP) ................. 2013-240264

(51) Int. Cl.
*G02B 17/08* (2006.01)
*G02B 19/00* (2006.01)
(Continued)

(52) U.S. Cl.
CPC ................ *G02B 5/10* (2013.01); *F21V 5/04* (2013.01); *F21V 7/0091* (2013.01); *F21V 7/06* (2013.01); *F21V 29/20* (2013.01); *F21V 29/503* (2015.01); *G01J 1/02* (2013.01); *G02B 17/086* (2013.01); *G02B 19/0028* (2013.01); *G02B 19/0042* (2013.01); *H01L 31/052* (2013.01); *H01L 31/0547* (2014.12); *H02S 20/30* (2014.12); *F21V 7/09* (2013.01); *F21V 7/22* (2013.01);
(Continued)

(58) Field of Classification Search
None
See application file for complete search history.

(56) References Cited

U.S. PATENT DOCUMENTS 2,254,962 A    9/1941 Lawrence et al.
4,131,485 A *  12/1978 Meinel ................. F24J 2/18
                                          126/685
(Continued)

FOREIGN PATENT DOCUMENTS

CN    101788708 A    7/2010
CN    102809807 A    12/2012
(Continued)

OTHER PUBLICATIONS

First Office Action with Retrieval Report dated Jun. 3, 2016 in Chinese Patent Application No. 2014104103350 (5 pages), with English translation (3 pages).
(Continued)

*Primary Examiner* — Jeff Vonch
(74) *Attorney, Agent, or Firm* — Finnegan, Henderson, Farabow, Garrett & Dunner, L.L.P.

(57) ABSTRACT

An optical element of an embodiment includes an optical element made of a material transparent to light, the optical element including: a back surface facing the front surface; and a connection surface. The front surface includes a recessed surface in a region facing the connection surface. The recessed surface has a point closest to the connection surface as a closest point, and has a first singular point other than the closest point.

28 Claims, 8 Drawing Sheets

(51) Int. Cl.

| | | |
|---|---|---|
| *F21V 7/04* | (2006.01) | |
| *F21V 7/06* | (2006.01) | |
| *F21V 29/00* | (2015.01) | |
| *H01L 31/052* | (2014.01) | |
| *H01L 31/054* | (2014.01) | |
| *G02B 5/10* | (2006.01) | |
| *G01J 1/02* | (2006.01) | |
| *F21V 5/04* | (2006.01) | |
| *F21V 7/00* | (2006.01) | |
| *F21V 29/503* | (2015.01) | |
| *H02S 20/30* | (2014.01) | |
| *G02B 17/00* | (2006.01) | |
| *F21V 7/09* | (2006.01) | |
| *H02S 40/22* | (2014.01) | |
| *F21V 7/22* | (2006.01) | |
| *H01L 33/58* | (2010.01) | |
| *F21Y 115/10* | (2016.01) | |

(52) U.S. Cl.
CPC ......... *F21Y 2115/10* (2016.08); *G02B 17/004* (2013.01); *G02B 17/0808* (2013.01); *G02B 17/0812* (2013.01); *G02B 17/0816* (2013.01); *G02B 17/0856* (2013.01); *G02B 17/0864* (2013.01); *G02B 17/0868* (2013.01); *G02B 17/0872* (2013.01); *G02B 17/0876* (2013.01); *G02B 17/0888* (2013.01); *G02B 19/0047* (2013.01); *G02B 19/0061* (2013.01); *G02B 19/0071* (2013.01); *H01L 33/58* (2013.01); *H02S 40/22* (2014.12); *Y02E 10/52* (2013.01); *Y10T 428/24273* (2015.01); *Y10T 428/24322* (2015.01); *Y10T 428/24479* (2015.01); *Y10T 428/24612* (2015.01)

(56) References Cited

U.S. PATENT DOCUMENTS

| | | | | |
|---|---|---|---|---|
| 4,337,758 A * | 7/1982 | Meinel | F24J 2/07 | 126/684 |
| 5,001,609 A * | 3/1991 | Gardner | F21S 48/215 | 257/98 |
| 5,062,899 A * | 11/1991 | Kruer | F24J 2/18 | 126/686 |
| 5,237,170 A * | 8/1993 | Shatz | F21V 7/04 | 250/216 |
| 5,526,190 A * | 6/1996 | Hubble, III | F21V 7/0091 | 347/102 |
| 5,757,557 A * | 5/1998 | Medvedev | F21L 4/027 | 359/708 |
| 5,841,596 A * | 11/1998 | Perlo | G02B 5/1876 | 359/732 |
| 5,930,055 A * | 7/1999 | Eisenberg | G02B 17/0808 | 359/727 |
| 6,097,549 A * | 8/2000 | Jenkins | B60Q 1/302 | 359/726 |
| 6,166,866 A * | 12/2000 | Kimura | G02B 17/0663 | 348/E5.025 |
| 6,473,554 B1 * | 10/2002 | Pelka | G02B 6/0018 | 385/146 |
| 6,639,733 B2 | 10/2003 | Minano et al. | | |
| 7,070,312 B2 * | 7/2006 | Tatsukawa | F21S 48/1154 | 362/327 |
| 7,111,964 B2 * | 9/2006 | Suehiro | G02B 6/0018 | 257/98 |
| 7,244,924 B2 * | 7/2007 | Kiyomoto | B60Q 1/302 | 250/216 |
| 7,460,985 B2 * | 12/2008 | Benitez | G02B 27/0012 | 703/2 |
| 7,566,148 B2 * | 7/2009 | Noh | H01L 33/54 | 362/305 |
| 7,638,708 B2 * | 12/2009 | Fork | H01L 31/052 | 136/246 |
| 7,697,219 B2 * | 4/2010 | DiDomenico | F24J 2/062 | 359/728 |
| 8,136,967 B2 * | 3/2012 | Weaver | F21V 3/04 | 362/298 |
| 8,297,786 B2 * | 10/2012 | Shani | G02B 5/021 | 362/247 |
| 8,412,010 B2 * | 4/2013 | Ghosh | F24J 2/06 | 126/684 |
| 8,419,232 B2 * | 4/2013 | Minano | G02B 3/0068 | 362/299 |
| 8,434,892 B2 * | 5/2013 | Zwak | G02B 6/0018 | 362/235 |
| 8,921,680 B1 * | 12/2014 | Wik | H02S 20/30 | 136/246 |
| 8,952,238 B1 * | 2/2015 | Gu | G02B 3/08 | 136/246 |
| 9,127,822 B2 * | 9/2015 | Hutson | F21S 11/00 | |
| 9,329,322 B2 * | 5/2016 | Yamada | G02B 19/0066 | |
| 9,360,190 B1 * | 6/2016 | Shum | F21K 9/60 | |
| 9,416,951 B1 * | 8/2016 | Householder | F21V 7/0091 | |
| 2002/0041453 A1 * | 4/2002 | Sekita | G02B 17/0663 | 359/857 |
| 2003/0016539 A1 * | 1/2003 | Minano | F21V 7/04 | 362/347 |
| 2003/0026002 A1 * | 2/2003 | Lopez-Hernandez | G02B 5/0278 | 359/641 |
| 2004/0070855 A1 * | 4/2004 | Benitez | G02B 3/02 | 359/858 |
| 2006/0126343 A1 * | 6/2006 | Hsieh | F21K 9/00 | 362/327 |
| 2006/0207650 A1 * | 9/2006 | Winston | H01L 31/0547 | 136/259 |
| 2006/0231133 A1 * | 10/2006 | Fork | F24J 2/06 | 136/246 |
| 2006/0266408 A1 * | 11/2006 | Horne | F24J 2/067 | 136/246 |
| 2007/0024990 A1 * | 2/2007 | Paek | G02B 6/0018 | 359/725 |
| 2007/0107769 A1 * | 5/2007 | Cobb | H01L 31/0547 | 136/246 |
| 2007/0251568 A1 * | 11/2007 | Maeda | G02B 19/0042 | 136/246 |
| 2008/0000516 A1 * | 1/2008 | Shifman | F24J 2/12 | 136/246 |
| 2008/0047605 A1 | 2/2008 | Benitez et al. | | |
| 2008/0115823 A1 * | 5/2008 | Kinsey | H01L 31/035281 | 136/246 |
| 2008/0137205 A1 * | 6/2008 | Spencer | F24J 2/18 | 359/601 |
| 2008/0163922 A1 | 7/2008 | Horne et al. | | |
| 2008/0165437 A1 * | 7/2008 | DiDomenico | F24J 2/062 | 359/728 |
| 2008/0203411 A1 * | 8/2008 | Chan | H01L 31/02008 | 257/98 |
| 2008/0316761 A1 * | 12/2008 | Minano | G02B 3/0068 | 362/518 |
| 2009/0071467 A1 * | 3/2009 | Benitez | F24J 2/085 | 126/685 |
| 2009/0159126 A1 * | 6/2009 | Chan | H01L 31/0547 | 136/259 |
| 2009/0219716 A1 * | 9/2009 | Weaver | F21V 3/04 | 362/235 |
| 2009/0260667 A1 | 10/2009 | Chen et al. | | |
| 2010/0002320 A1 * | 1/2010 | Minano | F21V 7/04 | 359/850 |
| 2010/0071768 A1 * | 3/2010 | Liu | F24J 2/06 | 136/259 |
| 2010/0078062 A1 | 4/2010 | Wang et al. | | |
| 2010/0201911 A1 * | 8/2010 | Iiyama | G02F 1/133603 | 349/61 |
| 2010/0206379 A1 * | 8/2010 | Littau | F24J 2/06 | 136/259 |
| 2010/0220484 A1 * | 9/2010 | Shani | G02B 5/021 | 362/296.09 |

(56) References Cited

U.S. PATENT DOCUMENTS

| | | | |
|---|---|---|---|
| 2010/0307586 A1* | 12/2010 | Benitez | G02B 19/0042 136/259 |
| 2011/0026130 A1* | 2/2011 | Winston | G02B 17/006 359/641 |
| 2011/0061718 A1* | 3/2011 | Fork | H01L 31/052 136/246 |
| 2011/0083721 A1 | 4/2011 | Imani | |
| 2011/0096426 A1* | 4/2011 | Ghosh | F24J 2/06 359/853 |
| 2011/0100419 A1* | 5/2011 | Maeda | F24J 2/1047 136/246 |
| 2011/0222309 A1* | 9/2011 | Shinohara | G02B 6/0018 362/560 |
| 2011/0247679 A1 | 10/2011 | Shelef et al. | |
| 2011/0260037 A1* | 10/2011 | Winston | F24J 2/06 250/208.1 |
| 2011/0292655 A1* | 12/2011 | Ing | G09F 13/14 362/241 |
| 2012/0055552 A1* | 3/2012 | Morgan | H01L 31/18 136/259 |
| 2012/0069575 A1* | 3/2012 | Koh | G02B 6/0021 362/296.01 |
| 2012/0069579 A1* | 3/2012 | Koh | G02B 6/0021 362/307 |
| 2012/0099325 A1* | 4/2012 | Ghosh | F24J 2/06 362/296.01 |
| 2012/0140352 A1* | 6/2012 | Morgan | H01L 31/0525 359/853 |
| 2012/0140464 A1* | 6/2012 | Huang | F21V 5/002 362/235 |
| 2013/0104984 A1* | 5/2013 | Myrskog | H01L 31/0543 136/259 |
| 2013/0201561 A1* | 8/2013 | McCluney | F21S 11/00 359/597 |
| 2014/0204587 A1* | 7/2014 | Hukkanen | G02B 3/08 362/308 |
| 2015/0083899 A1* | 3/2015 | Morgan | H01L 31/0525 250/216 |
| 2015/0127304 A1* | 5/2015 | Cassarly | G02B 27/0012 703/1 |

FOREIGN PATENT DOCUMENTS

| | | | |
|---|---|---|---|
| CN | 103026608 A | | 4/2013 |
| CN | 103185245 A | | 7/2013 |
| JP | 06342922 A | * | 12/1994 |
| JP | 2005197320 A | * | 7/2005 |
| JP | 2007140056 A | * | 6/2007 |
| JP | 2008-533752 | | 8/2008 |
| JP | 2008-252077 | | 10/2008 |
| JP | 2009-0529791 | | 8/2009 |
| JP | 2010-509899 | | 8/2009 |
| JP | 2010-516048 | | 5/2010 |
| JP | 2010153328 A | * | 7/2010 |
| WO | WO 2007/103994 A2 | | 9/2007 |

OTHER PUBLICATIONS

Miñano et al.; "A High-Gain, Compact, Nonimaging Concentrator: RXI", Applied Optics, vol. 34, No. 34, pp. 7850-7856, (1995).

* cited by examiner

OPTICAL ELEMENT AND OPTICAL DEVICE

CROSS-REFERENCE TO RELATED APPLICATION

This application is based upon and claims the benefit of priority from Japanese Patent Applications No. 2013-240264, filed on Nov. 20, 2013; the entire contents of which are incorporated herein by reference.

FIELD

Embodiments described herein relate generally to an optical element and an optical device.

BACKGROUND

A cost of a solar cell per light-concentration area may be reduced by a combination of the solar cell and a cheap light concentrator. The light concentrator is one of optical elements. A device in which the light concentrator and the solar cell are combined is called a light-collecting type solar cell. Further, given the restriction of installation space and weight, the light concentrator is desirably as thin as possible.

As a technology that realizes the above, there is a light concentrator called Refraction (R), refleXtion (X), and total Internal reflection (I) (RXI) type light concentrator. This light concentrator has a characteristic of being extremely thinner than a conventional compound parabolic concentrator (CPC) type light concentrator.

The above light concentrator has been described about a solar cell. However, a lighting emitting diode (LED) is arranged in a place where the solar cell is arranged, and the device can be used as an LED illumination collimator lens. This is realized by reversibility of rays (the device is established if the ray direction is reversed). That is, the solar cell is replaced with the LED, and the ray direction is reversed, similar discussion to the case of the solar cell can be made. Therefore, hereinafter, the solar cell and the LED are called connection elements to be connected to the optical element (the light concentrator or the collimator lens). Further, a device in which the out element and the connection element are combined is called non-imaging type optical device.

DETAILED DESCRIPTION

Figure 1:
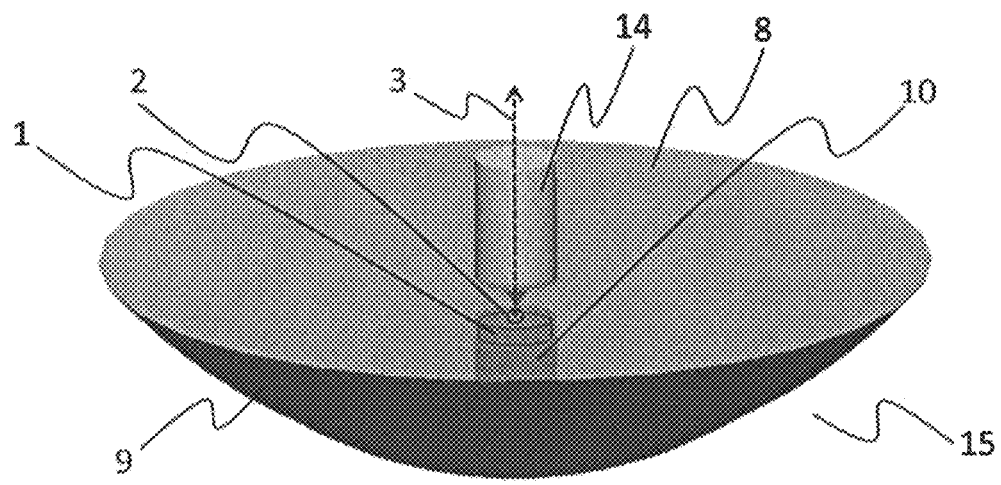
FIG. 1 is a bird's-eye view of an optical device of an embodiment.

An optical element of an embodiment includes: an optical element made of a material transparent to light, the optical element including: a back surface facing the front surface; and a connection surface. The front surface includes a recessed surface in a region facing the connection surface. The recessed surface has a point closest to the connection surface as a closest point, and has a first singular point other than the closest point.

An optical device of an embodiment includes an optical element and a light-receiving element or a light-emitting element. The optical element includes a front surface, a back surface facing the front surface, and a connection surface. The front surface includes a recessed surface in a region facing the connection surface. The recessed surface has a point closest to the connection surface as a closest point and has a first singular point other than the closest point, and the connection surface of the optical element is arranged to face a light-receiving surface of the light-receiving element or a light-emitting surface of the light-emitting element.

A conventional thin light concentrator described above has a metal (e.g., aluminum) deposition surface on each of an incident surface and a reflection surface. The length of one side of the metal deposition surface at the incident surface side is ten times larger than a connection element.

If the metal deposition surface is large, an area where sunlight is shaded becomes large. Therefore, utilization efficiency of light is decreased. Further, many rays being propagated inside the light concentrator are not only reflected by the metal deposition surface once, but further reflected by the metal deposition surface more than once. Reflection by a metal typically causes about a 10% loss due to absorption. Therefore, this also incurs a decrease in the utilization efficiency of light. As described above, the metal deposition surface is made small, and an optical element having a large area is required in the solar cell or a light-emitting device. Therefore, improvement of the utilization efficiency of light by a low-cost technology is an issue.

Further, concentrated light heats the solar cell, and the solar cell becomes a high temperature. This also causes a problem of occurrence of deterioration of the solar cell. When an LED is used in place of the solar cell, heat generation of the LED becomes a problem.

Hereinafter, an optical element and an optical device will be specifically described by embodiments.

First Embodiment

An optical element of a first embodiment is an optical element made of a material transparent to light, and includes a front surface, a back surface facing the front surface, and a connection surface. The front surface includes a recessed surface in a region facing the connection surface. The recessed surface has a point closest to the connection surface as a closest point, and includes a first singular point other than the closest point. The first embodiment will be described with reference to FIGS. 1 to 5. Hereinafter, a case in which a ray having been incident on an optical element 15 is introduced into a connection element 1 will be described, assuming a light-receiving type optical device where the connection element 1 is a solar cell, unless otherwise stated. In a case where the connection element 1 is a light-emitting type element, a ray is emitted from an optical element 15, and thus a ray path is reversed to the embodiment of the light-receiving type element. Description of an embodiment where the optical element 15 is a light-emitting type element is omitted in principle in the present embodiment. However, configurations and principles are basically common to each other. Vertically upward direction with respect to a light-receiving surface or a light-emitting surface of the connection element 1 is an upper direction, and a direction opposite to the upper direction is a down direction.

FIG. 1 is a bird's-eye view of an optical device. The optical device of FIG. 1 is configured from an optical element 15, a heat transfer body 14, and the connection element 1. The optical device of the embodiment is a non-imaging type optical device.

The connection element 1 has a round light-receiving surface (a light-emitting surface in the case of an LED) having a diameter of 20 mm. The connection element 1 is a light-receiving element or a light-emitting element. Specific examples of the connection element 1 include a photoelectric conversion element, an LED, and an organic electro luminescence (EL). However, the connection element 1 is not limited to the examples. If the connection element 1 is, for example, a light-receiving element, such as a photoelectric conversion element, the optical device of the embodiment is a light-receiving type optical device. If the connection element 1 is a light-emitting element, such as an LED or an organic EL, the optical device of the embodiment is a light-emitting type optical device. A favorable shape of the connection element differs according to the shape of the optical element 15. An example of the shape of the connection element 1 includes a rectangular shape, other than the round shape.

The optical element 15 is favorably an optically transparent material. The optical element 15 is an element, so-called light concentrator or a condenser. Examples of specific materials of the optical element 15 include acrylic, polycarbonate, and glass. However, the materials of the optical element 15 are not limited to the examples. At this time, a refractive index of the material of the optical element 15 is n. In the case of acrylic, n is about 1.49. The optical element 15 includes a front surface 8 on which the sunlight is incident and a back surface 9 facing the front surface 8. A connection surface 7 of the optical element 15 is arranged to face a light-receiving surface or a light-emitting surface of the connection element 1 or to be connected with the connection element 1. A void 10 is included in a lower portion of the connection surface 7 of the optical element 15.

Figure 4:
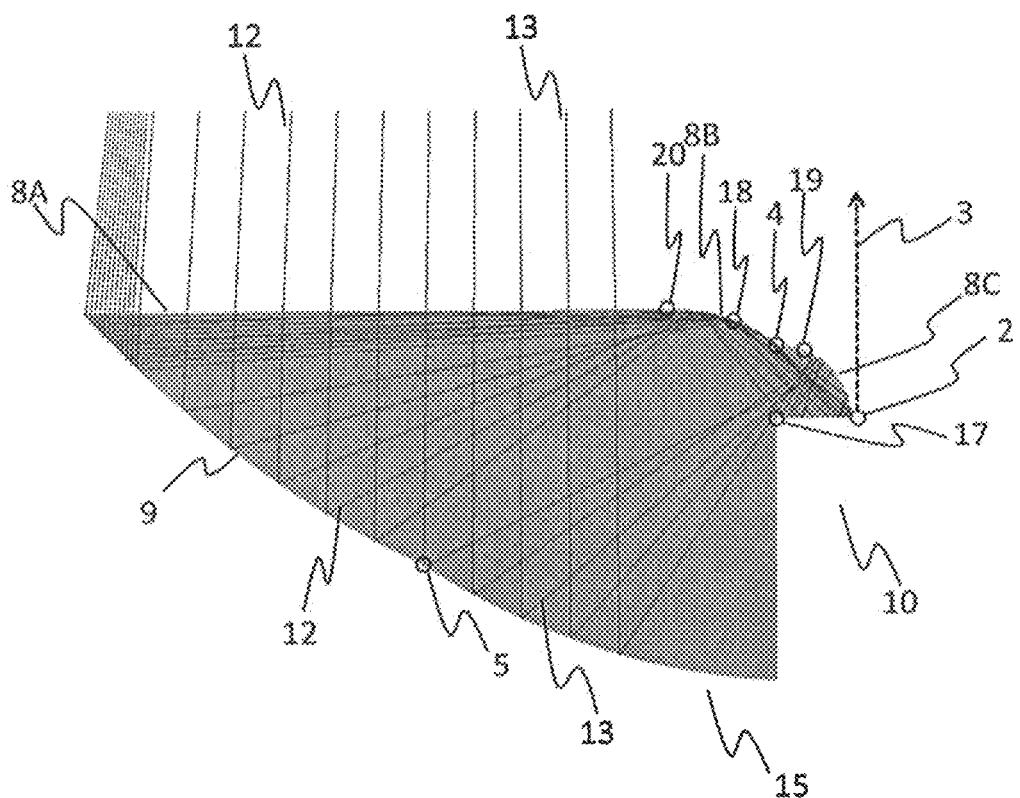
FIG. 4 is a cross-sectional conceptual diagram and a ray diagram of an optical element of an embodiment.

FIG. 4 illustrates a cross-sectional conceptual diagram in which a part of the optical element 15 is enlarged. This diagram uses a plane including a rotational symmetry axis 3 as the cross section. In FIG. 4, the front surface 8 includes a first front surface 8A, a second front surface 8B, and a third front surface 8C. It is favorable that the first front surface 8A includes a plane or a convex curved surface. It is favorable that the second front surface 8B and the third front surface 8C include convex curved surfaces. The first front surface 8A is a surface on which rays are incident from an outside. A part of the rays reflected by the back surface 9 is totally reflected by the second front surface 8B. A part of rays 13 reflected by the back surface 9 is reflected by the third front surface 8C. On the front surface 8 and the back surface 9, the reflection is performed on a reflection surface provided in the optical element 15.

The second front surface 8B exists between the first front surface 8A and the third front surface 8C. One end portion of the first front surface 8A and one end portion of the second front surface 8B are connected. The other end portion of the second front surface 8B and the other end of the third front surface 8C are connected. The second front surface 8B includes a convex curved surface on which a part of rays 12 reflected by the back surface 9 is totally reflected once, or twice or more. For example, by making an area ratio of the second front surface 8B to the first front surface 8A large, it is favorable that a largely inclined incident, ray can also be introduced to the connection surface 7 by total reflection, and an angle of a ray that can be concentrated or distributed is increased. The twice or more total reflection is continuously performed. In a region facing the connection surface 7, the second front surface 8B and the third front surface 8C form a recessed surface. It is favorable to include a first singular point 4 between the second front surface 8B and the third front surface 8C. It is favorable to include the reflection surface (third front surface 8C) from the first singular point 4 to a closest point closest to the connection surface 7 of the front surface 8. The third front surface 8C favorably includes a reflection surface subjected to reflection coating on the third front surface 8C or a reflection surface being physically in contact with the third front surface 8C. Examples of the reflection surface include a metallic surface and a white colored surface. The reflection surface can be formed by a known method, such as a chemical vapor deposition (CVD), physical vapor deposition (PVC), or application. Alternatively, a reflection member including such a surface being in contact with the third front surface 8C may be joined. In a case of aluminum evaporation, the regular reflectance is about 90%.

The back surface 9 includes a metallic or white colored reflection surface so that rays 11 having been incident on an inside of the optical element 15 are reflected in the inside. A method of forming the back surface 9 is similar to the reflection surface of the third front surface 8C.

The optical element 15 has a rotationally symmetrical shape with respect to the rotational symmetry axis 3, for example. Here, rotational symmetry means that, when the optical element 15 is rotated around the rotational symmetry axis 3 as a rotation axis, the optical element 15 coincides with its original shape with a rotation angle less than 360°.

A center point 2 exists on the rotational symmetry axis 3, and is a point closest to the third front surface 8C. Here, the maximum diameter (the maximum dimension in a direction perpendicular to the rotational symmetry axis 3) of the optical element 15 is 192 mm, for example, and the thickness (the maximum dimension in a direction along the rotational symmetry axis 3) is 49 mm, for example. Note that the optical element 15 may have a shape without symmetry.

Figure 2:
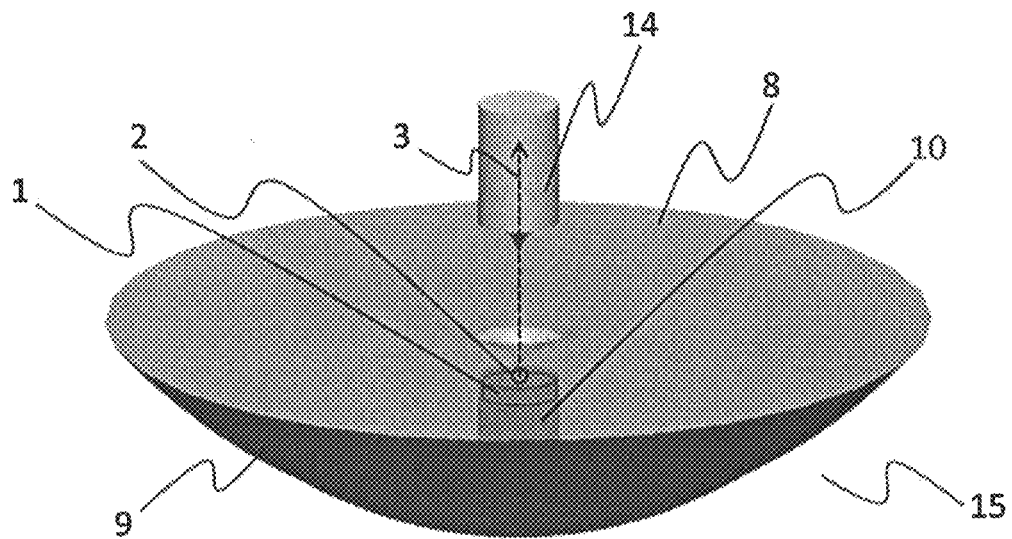
FIG. 2 is a bird's-eye view of an optical element and an optical device of an embodiment.

FIG. 2 is a bird's-eye view of when the optical element 15 and the heat transfer body 14 are separated. The heat transfer body 14 is a member that cools the connection element 1. The heat transfer body 14 is favorably a member having high thermal conductivity, and examples include copper, aluminum, and carbon. However, the member of the heat transfer body 14 is not limited to the examples. The heat transfer body 14 may be omitted in practical use. However, from a viewpoint of heat dissipation, it is favorable to provide the heat transfer body 14. When the heat transfer body 14 is omitted, the region of the heat transfer body 14 can be replaced with the void 10. A surface having high regular reflectance along the third front surface 8C may be provided on the heat transfer body 14, joined with the third front surface 8C, and used as a reflection surface of the third front surface 8C. A tip end surface of the heat transfer body 14 is in contact with or adjacent to the third front surface 8C. That is the heat transfer body 14 penetrates the optical element 15, and is in contact with or adjacent to the connection element 1. At this time, the heat transfer body 14 (the reflection surface provided on the third front surface 8C) is favorably in contact with the connection element 1 and dissipates heat of the connection element 1. The diameter (width) of the heat transfer body 14 is favorably the width of the connection element 1 or less, and is 20 mm, for example. If the diameter of the heat transfer body 14 is larger than the width of the connection element 1, the ratio of light being shaded by the heat transfer body 14 becomes large, and a decrease in the utilization efficiency of light is caused. In the present embodiment, the diameter of the heat transfer body 14 can be the width (diameter) of the connection element 1 or less. The heat transfer body 14 absorbs the heat of the connection element 1 from the vicinity of its tip end surface, and can dissipate the heat to an outside of the optical device. Further, a fin or the like may be arranged on the heat transfer body 14, and improve the heat dissipation characteristic. When the heat transfer body 14 itself absorbs the rays, and heat generation due to the heat absorption cannot be ignored, it is favorable to prevent heating of the connection element 1 due to the rays by increasing the reflectance by whitening on the heat transfer body 14, or the like.

Figure 3:
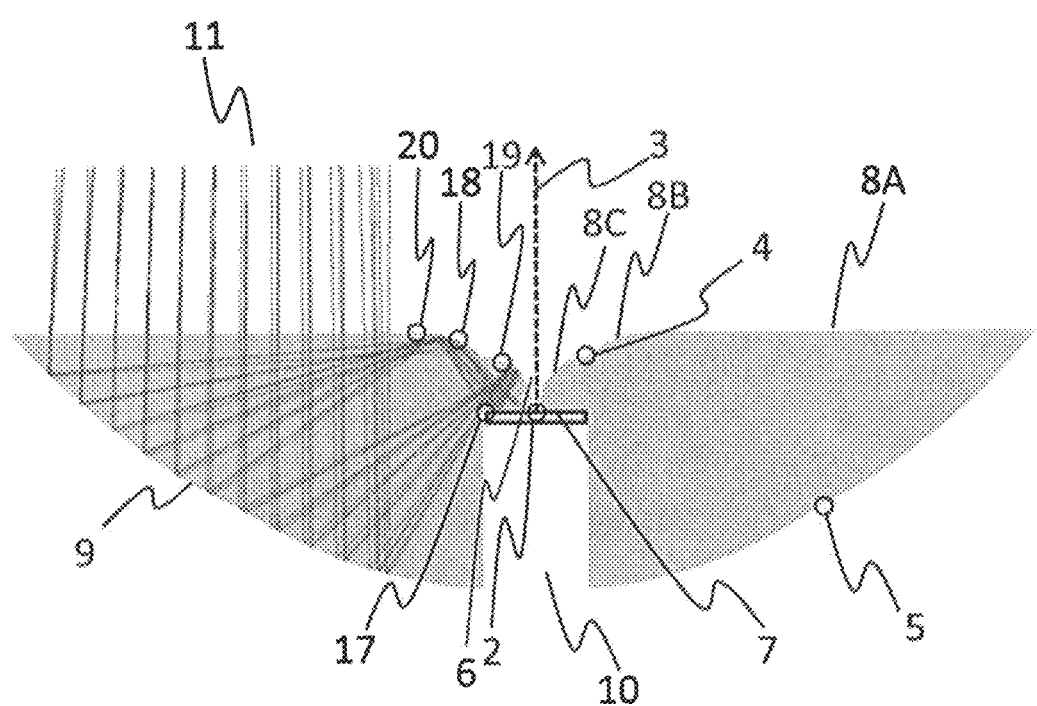
FIG. 3 is a cross-sectional conceptual diagram and a ray diagram of an optical element of an embodiment.

FIG. 3 illustrates a cross sectional view of the optical element 15. FIG. 3 uses a plane including the rotational symmetry axis 3 as a cross section. In FIG. 3, the rays 11 are illustrated by arrow lines. Hereinafter, a ray path of the embodiment will be described in detail with reference to FIG. 3.

The front surface 8 is a plane in which the first front surface 8A, the second front surface 8B, and the third front surface 8C are connected in order. Both of the first front surface 8A and the second front surface 8B are convex curved surfaces. The first front surface 8A is a plane. The front surface 8 includes the first singular point 4 between the second front surface 8B and the third front surface 8C. A center hole 6 is a hole penetrating the optical element 15. The center hole 6 penetrates the third front surface 8C, and a bottom portion of the center hole 6 reaches the connection element 1. The connection surface 7 faces the third front surface 8C. The back surface 9 includes a second singular point 5, and a semi-parabolic surface having the second singular point 5 as a boundary. The center hole 6 is provided from the front surface 8 to the back surface 9, so that heat generated in the connection element 1 can be dissipated to an external environment. When the beat transfer body 14 is attached, a configuration of the embodiment can further improve the heat dissipation performance.

First, a shape of the front surface 8 from the first singular point 4 to the first front surface 8A will be described. A condition that satisfies the first singular point 4 will be described using an (expression 1) and an (expression 2). Note that a plurality of points that satisfies the condition for serving as the first singular point 4 may exist on the front surface 8. This drawing illustrates a case in which the first singular point 4 is one. Therefore, the shape of the front surface 8 from the first singular point 4 to the first front surface 8A is defined by the second front surface 8B that includes one convex curved surface.

An end portion of the connection surface 7 is a first point 17. A second point 18 is taken on any point on the second front surface 8B. A second distance is larger than a first distance where the length of a first line connecting the first point 17 and the first singular point 4 is the first distance, and the length of a second line connecting the first point 17 and the second point 18 is the second distance. An angle made by a normal line in the second point 18 and the second line is $\theta_1$, and the refractive index of the optical element 15 is n. At this time, it is favorable to satisfy the (expression 1) from a view point that the ray 12 that reaches the second point 18 is totally reflected once or more, and finally reaches the connection surface 7. Further, it is favorable that the second point 18 satisfies the (expression 1) in all of points on the second front surface 8B from the above reason.

$$\theta_1 \geq \sin^{-1}\left(\frac{1}{n}\right) \qquad \text{(Expression 1)}$$

Next, the shape of the third front surface 80 from the first singular point 4 to the center point 2 will be described. A third point 19 is taken at any point on the third front surface 80. A third distance that is the distance of a third line connecting the third point 19 and the first point 17 is smaller than the first distance. Further, it is favorable to satisfy the expression (2) from a viewpoint that the ray 11 that reaches the third point 19 is reflected, and reaches the connection surface 7, where an angle made by a normal line in the third point 19 and the third line is $\theta_2$, and the refractive index of the optical element 15 is n. Further, it is more favorable that the third point 19 satisfies the (expression 2) in all of points on the third front surface 80. Further, it is favorable that a normal line that becomes parallel to the connection surface 7 exists among normal lines in the points on the recessed surface, from a viewpoint that the third front surface ac is made most compact, and a loss due to reflection on the surface is decreased. It is preferable that a orthogonal point is included in the connection surface, where the orthogonal point is a point that a perpendicular line from the first singular point to the connection surface and the connection line cross each other at right angle.

$$\theta_2 < \sin^{-1}\left(\frac{1}{n}\right) \qquad \text{(Expression 2)}$$

Next, the second singular point 5 will be described. A fourth point 20 is taken on a point where the first front surface 8A and the second front surface 8B are connected. An (expression 3) is as follows where an angle made by a fourth line connecting the fourth point 20 and the second singular point 5, and a normal line in the fourth point 20 is $\theta_3$, and the refractive index of the optical element 15 is n. It is favorable to satisfy the expression (3) from viewpoint that the ray 11 that has been reflected by the second singular point 5 and reaches the fourth point 20 is further totally reflected, and finally reaches the connection surface 7.

$$\theta_3 \geq \sin^{-1}\left(\frac{1}{n}\right) \qquad \text{(Expression 3)}$$

Next, a function of the optical element 15 will be described.

In FIG. 4, rays are also illustrated together. The ray A12 is incident from the front surface 8, reflected once by a point on the reflection surface of the back surface 9, the distance of the point, from the connection surface 7 being farther than the distance of the second singular point 5 from the connection surface 7, and then totally reflected by the second front surface 8B once or more.

The number of total reflection is once in a conventional RXI. The total reflection is reflection in which a loss of the amount of light due to absorption is not caused. Therefore, even if the reflection is performed any number of times, there is no loss of the amount of light due to the total reflection. The ray A12 is finally led to the connection surface 7 after such a large number of times of total reflection. If a large number of total reflection is performed, there is an advantage that the amount of light that can be led to the connection surface 7 without being reflected by the third front surface 8C is increased. As described above, the ray A12 is reflected by the back surface 9 once, and the loss of the ray can be decreased, compared with twice of reflection. Therefore, the utilization efficiency of light can be increased.

A ray B13 is incident from the front surface 8, reflected once by a point on the reflection surface of the back surface 9, the distance of the point from the connection surface 7 being closer than the distance of the second singular point 5 from the connection surface 7, further reflected by the third front surface 8C, and finally led to the connection surface 7. The reason why the ray B13 reflected by the third front surface 8C is led to the connection surface 7 is that the expression (2) is established.

As described above, the loss of the ray B13 is caused by the twice of reflection at the reflection surface. At this time, it can be considered that the utilization efficiency of light becomes higher as the area of the third front surface 8C is smaller, that is, the area of the metal deposition surface is smaller. The area of the third front surface 8C projected on the connection surface 7 is the same as the area of the connection surface 7. This area is extremely smaller than a conventional area of about ten times. When the second front surface 8B is provided, total reflection is performed on the surface, and the above condition is satisfied, the area of the third front surface 8C projected on the connection surface 7 can be made small.

As described above, by providing the first singular point 4 and the second singular point 5, two ray paths of the ray A12 and the ray B13 can be created. The first singular point 4 is a boundary point, between the second front surface 8C and the third front surface 8C. Further, the second singular point 5 is a branch point of the ray A12 totally reflected by the second front surface 8B and the ray B13 reflected by the third front surface 8C, among the rays 11 reflected by the back surface 9. That is, the optical element 15 can create two or more ray paths at the same time. Accordingly, the optical element 15 as a whole can be downsized, the loss of the amount of light due to reflection can be made small, and the utilization efficiency of light can be enhanced. Further, the rays totally reflected by the second front surface 8B and directly introduced to the connection element 1 are increased, whereby the utilization efficiency of light is improved.

Further, in the example of the embodiment, the optical element 15 is about 2.45 times the thickness of the connection element 1. This is sufficiently thinner than a conventional case. Therefore, there is an effect that an installation space is not easily restricted. By using the thin optical element 15, there is an advantage that light-concentrating directions of optical devices can be changed even if a plurality of optical devices is closely arranged.

Further, by providing the heat transfer body 14, heat of the connection element 1 can be released to en external environment, and performance deterioration of the connection element 1 due to the heat can be suppressed. Therefore, the utilization efficiency of light of the connection element 1 itself can be enhanced.

Second Embodiment

Figure 5:
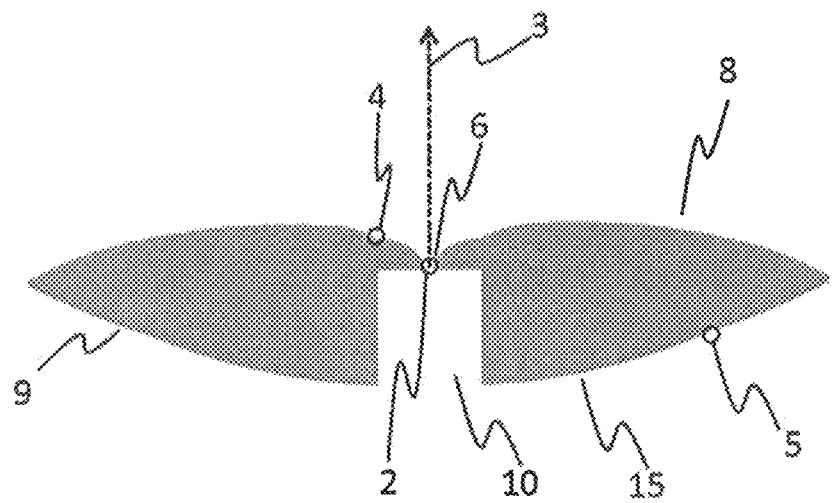
FIG. 5 is a cross-sectional conceptual diagram of an optical element of an embodiment.

FIG. 5 illustrates a cross-sectional conceptual diagram of an optical element 15 that configures an optical device of a second embodiment. A difference between the cross-sectional conceptual diagrams of FIGS. 3 and 5 is that a first front surface 8A of FIG. 5 is a convex curved surface. The optical element 15 can be further thinner using the refraction of the convex curved surface.

Third Embodiment

Figure 6:
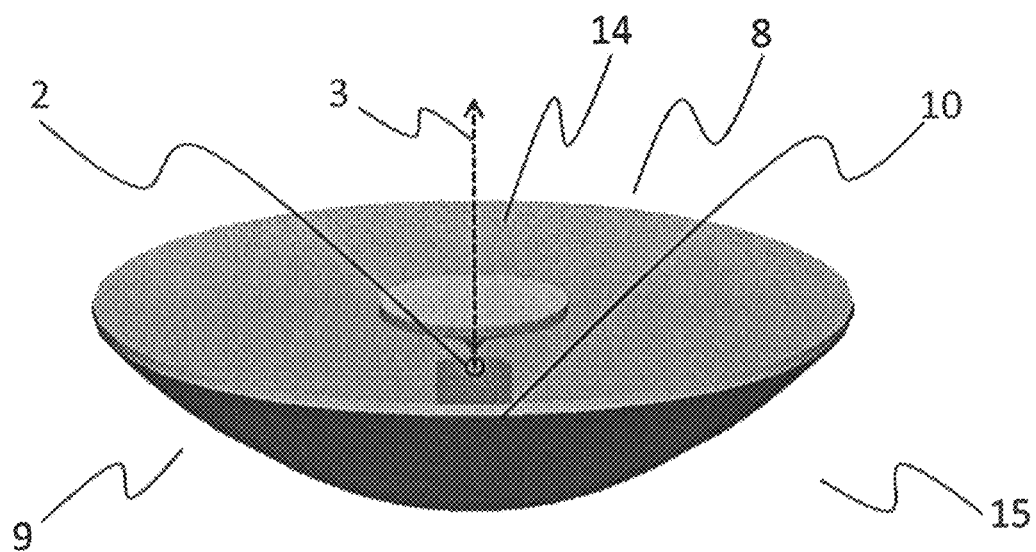
FIG. 6 is a bird's-eye view of an optical device of an embodiment.
Figure 7:
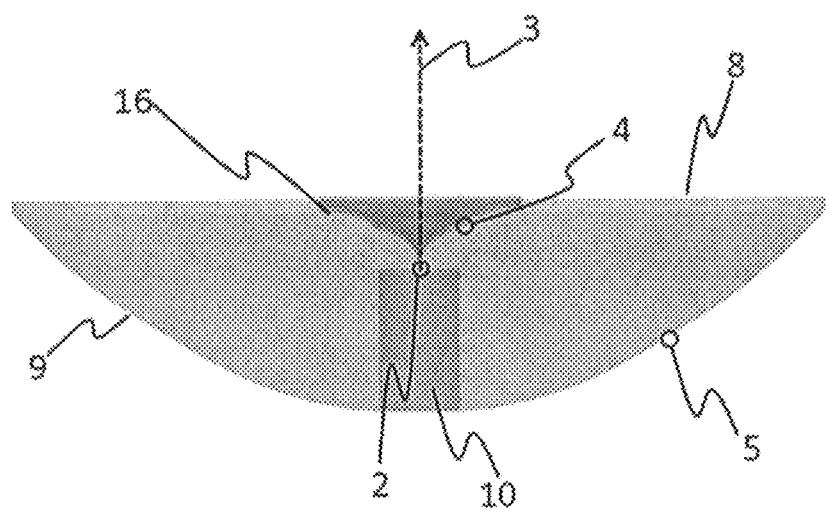
FIG. 7 is a cross-sectional conceptual diagram of an optical element of an embodiment.

The bird's-eye view of FIG. 6 and the cross-sectional conceptual diagram of FIG. 7 illustrate conceptual diagrams of an optical device of a third embodiment. A heat transfer body 14 may be provided with a screw 16. With the screw 16, the heat transfer body 14 can be easily fixed to an optical element 15. Here, the heat transfer body 14 is a male screw, and a center hole 5 of the optical element 15 is a female screw.

Fourth Embodiment

Figure 8:
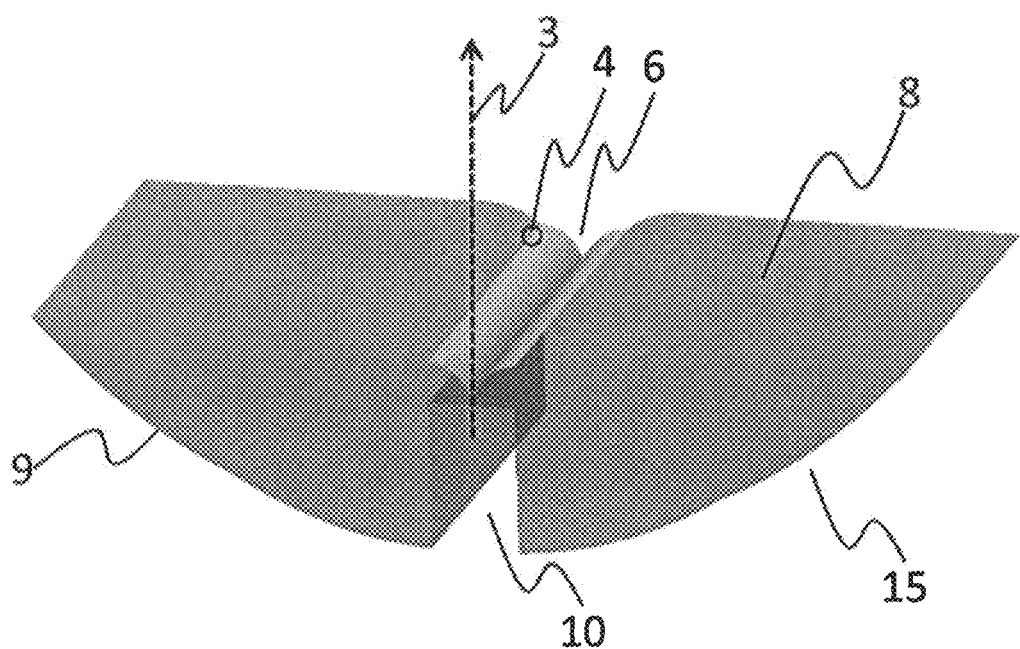
FIG. 8 is a bird's-eye view of an optical device of an embodiment.

The bird's-eye view of FIG. 8 illustrates an optical device of a fourth embodiment. The optical device of the fourth embodiment is a 180°-rotational symmetry body. In the present embodiment, there is an advantage that two perpendicular axes in a light-concentration surface can independently have a light-concentration action, which is different from the case of the rotary body of the first embodiment. The optical device of the fourth embodiment has an advantage of a less dead space associated with installation because the optical device can be installed on a rectangular installation surface, instead of a circular installation space. Note that side surfaces of an optical element 15 are favorably reflection surfaces. If the side surfaces of the optical element 15 are metallic or white colored reflection surfaces, there is an advantage that a ray 11 having been incident on an inside of the optical element 15 is reflected by the side surface, and is introduced to a connection element 1.

Fifth Embodiment

Figures 9, 10A:
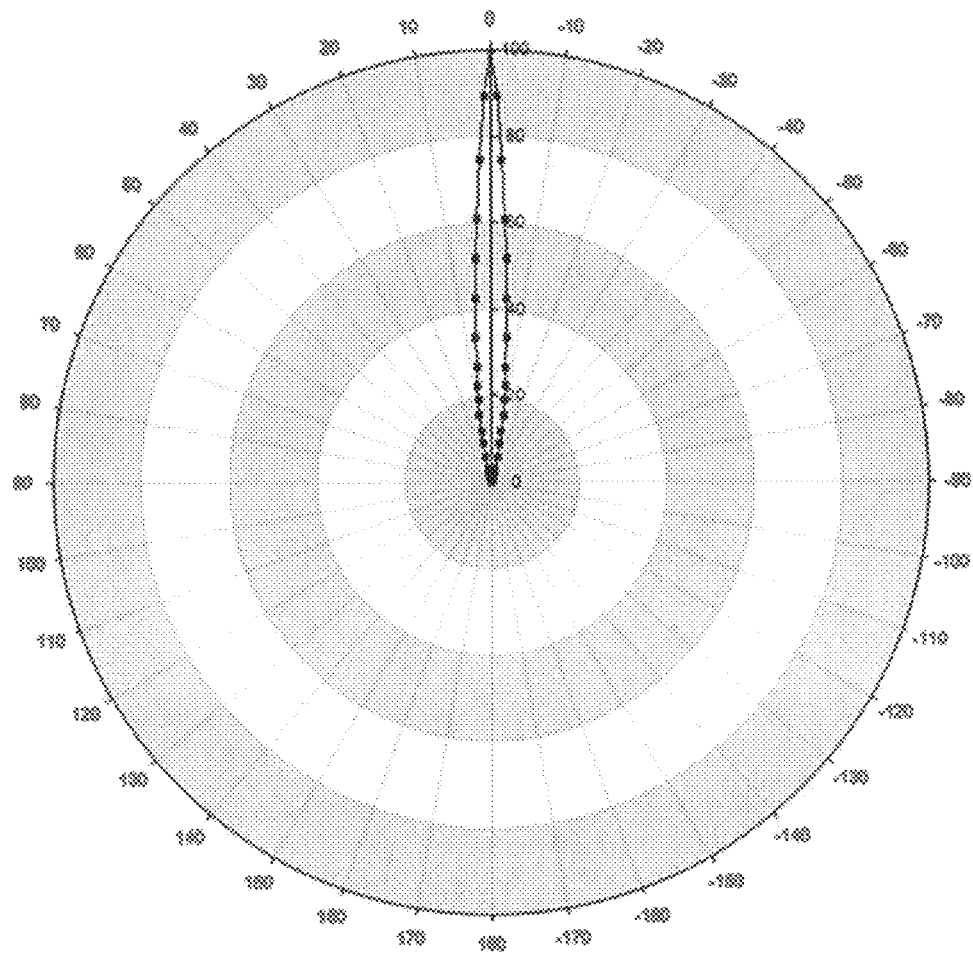
FIG. 9 is a light distribution of an optical device of an embodiment.
FIGS. 10A and 10B are conceptual diagrams of a power generator of an embodiment.

A fifth embodiment is an optical device in which an LED is arranged as a connection element 1. The fifth embodiment is common to the first embodiment, except for the connection element 1. Even if the connection element 1 is a light-emitting element, the light having been incident from the connection surface 7 has the same ray path as the optical element 15 of the first embodiment. The optical device of the fifth embodiment has a ray path opposite to the first embodiment, and functions as an LED illumination device. A light distribution characteristic of the fifth embodiment is illustrated in FIG. 9. This diagram is made such that luminous intensity is plotted with a radar chart with respect to light distribution angles. Note that the luminous intensity is standardized where the 0° direction of light distribution angle is 100. From the diagram, it is found that the optical device functions as illumination with a narrow angle, which is a ½ light distribution angle of 5°. The light distribution angle is a light distribution angle favorable as a downlight or a spotlight. Instrument efficiency of an optical device having a light-emitting element of the configuration of the embodiment is about 84%.

Sixth Embodiment

An optical device of a sixth embodiment is similar to the optical device of the first embodiment, except that a second point 18 of the optical device is continuous from a first singular point 4 to a connection point of a first front surface 8A and a second front surface 8B. In a fourth point 20, a normal line direction thereof and a connection surface 7 are perpendicular to each other. When such a fourth point 20 exists, the area of the second front surface 80 can be made larger than a case where no fourth point 20 exists. At this time, the optical device including the second front surface 80 has many rays 12 that are totally reflected a large number of times. Therefore, it is favorable from a viewpoint that there are many rays 12 that, are introduced to a connection element 1 by total reflection without being reflected by a third front surface 8C of a front surface 8. Further, in the fourth point 20, the first front surface 8A and the second front surface 8B are smoothly connected. Therefore, there is an advantage that processing of an optical element 15 becomes easy at the time of manufacturing the optical element 15.

Seventh Embodiment

An optical device of a seventh embodiment is similar to the optical device of the first embodiment, except that the optical device satisfies a condition of a following (expression 4) at any point on a second front surface 8B that connects a first singular point 4 and a fourth point 20. It is favorable to satisfy the following (expression 4) where an angle made by any point on the second front surface 8B that connects the first singular point 4 and the fourth point 20, that is, normal lines in all of points on the second front surface 8B, and a line that connects the point and a first point 17 is $\theta_4$, and the refractive index of the optical element 15 is n.

$$\theta_4 = \sin^{-1}\left(\frac{1}{n}\right) \quad \text{(Expression 4)}$$

When the optical device satisfies the condition, the areas of the second front surface 8B and a third front surface 8C can be minimized. Therefore, it is favorable from a viewpoint of downsizing of the device.

Additionally noting an optical element and an optical device in the embodiment, it is favorable that the optical element includes an optical element including a front surface and a back surface facing the front surface, the back surface includes a reflection surface, and the front surface includes a metallic surface that reflects a part of rays reflected by the back surface, a surface that reflects a part of the rays reflected by the back surface, a surface that totally reflects the part of the rays reflected by the back surface, and a through hole that penetrates the optical element.

Further, it is favorable that the front surface includes a first front surface, a second front surface, and a third front surface, the first front surface is a surface on which a ray is incident from an outside, the second front surface exists between the first front surface and the third front surface, and the second front surface is a surface that totally reflects a part of rays reflected by the back surface.

Further, another optical element favorably includes an optical element including a front surface and a back surface facing the front surface, and it is favorable that the back surface includes a reflection surface, the front surface includes a first front surface, a second front surface, and a third front surface, the first front surface is a surface on which a ray is incident from an outside, the second front surface exists between the first front surface and the third front surface, the second front surface includes a convex curved surface that totally reflects a part of rays reflected by the back surface once, or twice or more, and the third front surface is a metallic surface that reflects the part of rays reflected by the back surface. Further, it is favorable to be provided a through hole that penetrates the optical element.

Connection surfaces connected with the third front surfaces of these optical elements become optical devices by being connected with a connection element. Further, it is favorable that a ray totally reflected by the second front surface is introduced into the connection element, and a ray reflected by the third front surface is introduced into the connection element. It is favorable that the connection element is a light-receiving element or a light-emitting element, and the light-receiving surface or the light-emitting surface is connected with a connection surface of the optical element. It is favorable that a heat transfer body is provided in the through hole, and the heat transfer body is connected with the connection element. It is favorable that the heat transfer body is the metallic surface of the third front surface.

Eighth Embodiment

Figure 10B:
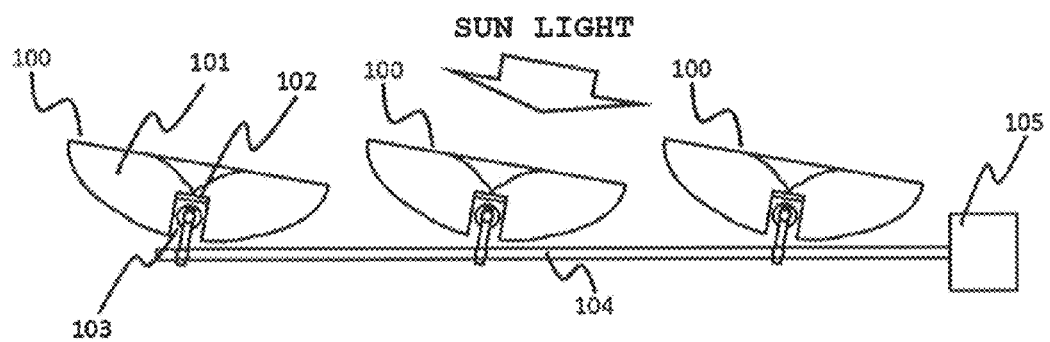

An eighth embodiment includes a plurality of light-concentrating type solar cell devices (hereinafter, simply referred to as solar cells) including a photoelectric conversion element, and an optical element connected with the photoelectric conversion element and including a void in a lower portion of a connection surface connected with the photoelectric conversion element. The plurality of solar cells is a power generator coupled by a coupling member provided in the void, and the plurality of solar cells is rotated by the coupling member. The conceptual diagrams of FIGS. 10A and 10B illustrate the power generator of the eighth embodiment. The power generator of FIGS. 10A and 10B includes an optical element 101, a photoelectric conversion element 102 connected with the optical element 101, and a plurality of solar cells 100 including an void 103 in a lower portion of the photoelectric conversion element 102. The plurality of solar cells 100 is coupled by the coupling member provided in the void 103. A coupling member 104 has a configuration capable of being driven such that the solar cells 100 are rotated by a driving device 105. An optical device including an optical element having an RXI-type void can be used as the solar cell 100, of than the optical device of the embodiment. It is favorable that the optical elements of the both optical devices are thin and light. If thin-type solar cells 100 are used in the embodiment, the plurality of solar cells 100 can be closely arranged, and the directions thereof can be changed. If all solar cells are used in the embodiment, a range in which the solar cells interfere becomes large when an angle is changed, and thus the solar cells cannot be closely arranged. Therefore, the optical device of the embodiment or the optical device having the RXI-type void is favorable for the solar cell 100 of the embodiment. Usually, a configuration for waste heat, such as the photoelectric conversion element 102, is provided on the back surface of the optical element. However, in the configuration of the embodiment, the void 103 can be provided in the back surface. However, there are many cases in which a space where the waste heat configuration is arranged is not sufficient in the void 103. Therefore, in the configuration of the embodiment, the waste heat configuration can be further provided on the surface of the optical element. Accordingly, the waste heat performance can be improved, and the utilization efficiency of light can be enhanced.

Figure 11A:
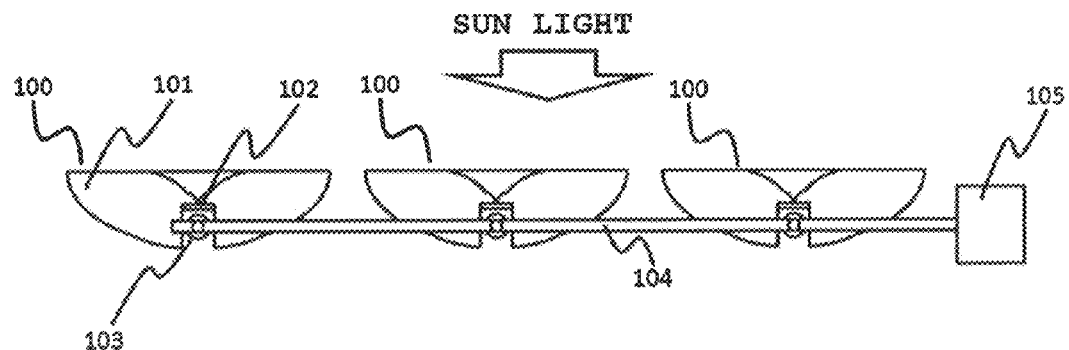
FIGS. 11A and 11B are conceptual diagrams of a power generator of an embodiment.
Figure 11B:
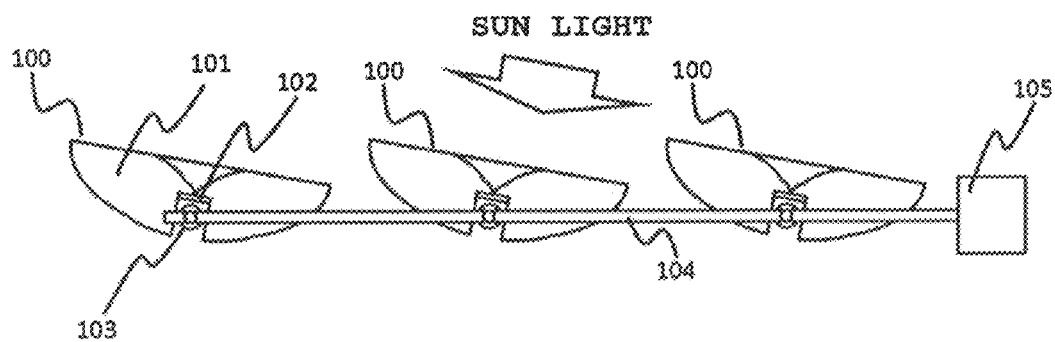

The coupling member 104 illustrated in the conceptual diagram of FIG. 10A includes a shaft, and the shaft and the member in the void 103 are coupled. When the shaft is moved, the solar cells 100 are rotated as illustrated in the conceptual diagram of FIG. 10B. Further, as illustrated in the conceptual diagrams of FIGS. 11A and 11B, the coupling member 104 is made to the same height as the shaft in the void, and the solar cells 100 can be rotated from FIG. 11A to FIG. 11B. In the configuration illustrated in the conceptual diagrams of FIGS. 11A and 11B, the solar cells 100 can be rotated by using a plurality of gears, a motor, or the plurality of gears and the motor together. Since the direction of sunlight is changed according to the day and time, it is favorable to rotate the solar cells 100 to face a direction into which the optical elements 101 can concentrate the rays. The solar cell 100 has different angles that can be concentrated depending on an optical element 101. It is favorable to change the angles of the solar cells 100 according to the time when the angles that can be concentrated are narrow, such as ±5°. Further, it is favorable to change the angles of the solar cells 100 every month or every several months when the angle that can be concentrated is wide, such as 20°. The optical element 101 of the embodiment has the void 103 in the lower portion of the photoelectric conversion element 102, and thus the directions of the solar cells 100 can be changed using a free region. Further, the plurality of solar cells 100 has the rotation shaft at the same position, and the rotation shafts are coupled. Therefore, the plurality of solar cells 100 can be changed to the same direction. There is an advantage that the directions of the plurality of solar cells 100 can be changed with small energy because of having the thin and light optical elements. Note that the coupling member 104 can employ a known rotation mechanism, such as a rotation mechanism using a gear, other than the illustrated embodiment.

Figure 12:
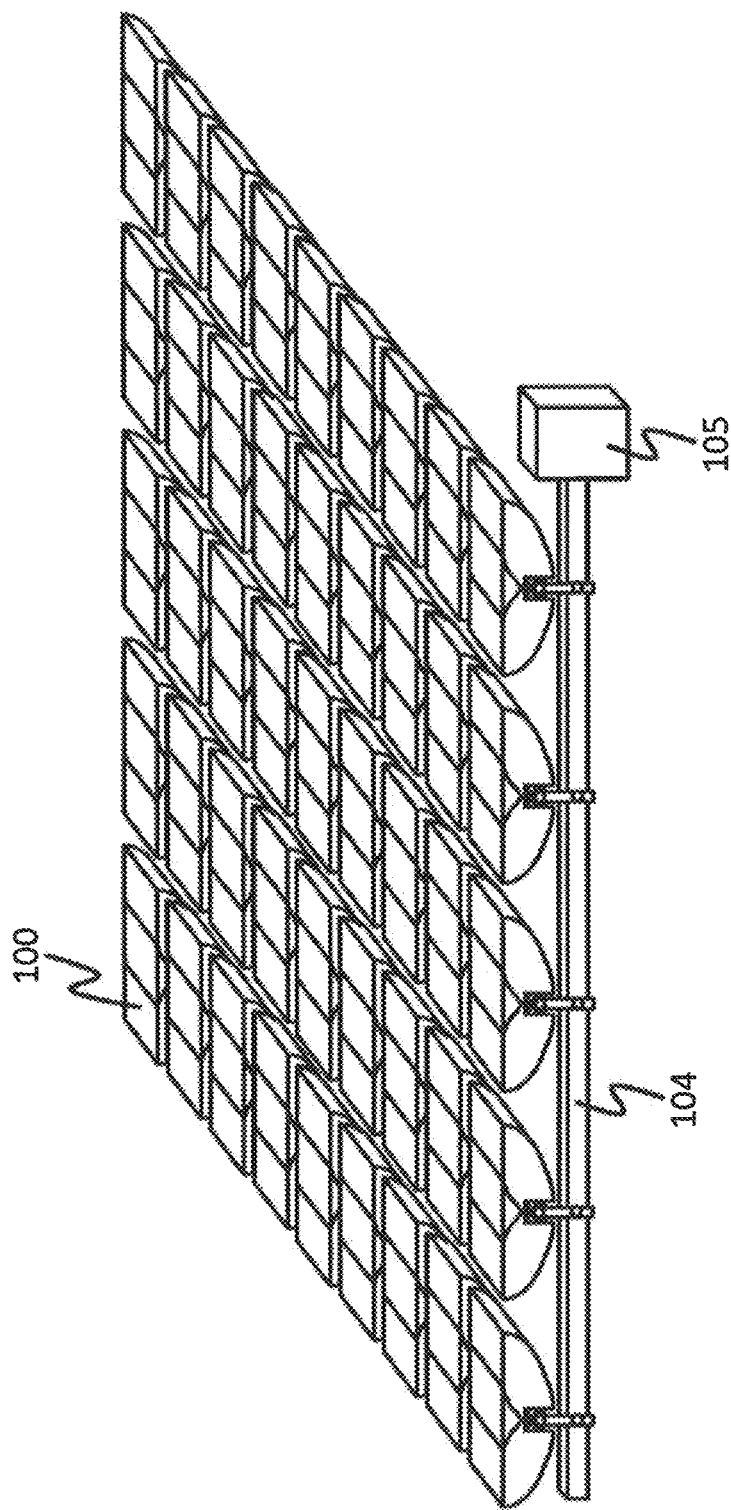
FIG. 12 is a conceptual diagram of a power generator of an embodiment.

The conceptual diagram of FIG. 12 illustrates a power generator in which the solar cells 100 arranged in a lattice manner are coupled. The solar cells 100 can be coupled using a shaft passing through the void 103. Further, by coupling the solar cells 100 like the conceptual diagrams of FIGS. 10A and 10B, the solar cells 100 arranged in a lattice manner can be coupled to one By coupling the solar cells 100 to one, the control of the directions of the solar cells becomes easy and simple.

Further, it is favorable that the coupling member 104 further includes a steering device. If the steering device is further included, the directions of the solar cells 100 can be changed by two axes. Therefore, there is an advantage that the solar cells 100 can be further adjusted to the direction of sunlight. The steering device can change the directions of the plurality of coupled solar cells 100 in the same direction, similarly to the above-described rotation.

Hereinafter, additionally noting a configuration of the eighth embodiment, it is favorable that the power generator includes a plurality of optical devices including a photoelectric conversion element, and a solar cell connected to the photoelectric conversion element and having a void in a lower portion of a connection surface connected with the photoelectric conversion element, and the plurality of optical devices is coupled by a coupling member provided in the void, and the plurality of optical devices is rotated by the coupling member.

Further, the plurality of optical devices is favorably rotated in the same direction. Further, the plurality of optical devices is favorably arranged in a lattice manner. Further, the coupling member favorably further includes a steering device. Further, the plurality of optical devices is favorably the optical device of the embodiment.

Several embodiments have been described. However, these embodiments are exemplarily presented, and are not intended to limit the scope of the invention. These new embodiment can be implemented in other various forms, and various omission, replacements, and changed can be made without departing from the gist of the invention. These embodiment and its modifications are included in the scope and gist of the invention, and are also included in the invention described in claims and its equivalents.

What is claimed is:

1. A light receiving optical element made of a material transparent to light, the optical element comprising:
    a front surface having a first surface, a second surface and a third surface;
    a back surface facing the front surface; and
    a fourth surface connecting to the third surface,
    wherein the front surface includes a recessed surface in a region facing the fourth surface,
    the recessed surface includes the second surface and the third surface,
    the recessed surface has a point closest to the fourth surface as a closest point, and has a first singular point being a discontinuous slope point other than the closest point,
    the second surface is situated between the first surface and the third surface,
    the first singular point is a boundary point between the second surface and the third surface,
    the back surface has a fifth surface and a sixth surface,
    a second singular point being a discontinuous slope point is included in the back surface,
    the second singular point is a boundary point between the fifth surface and the sixth surface,
    the fifth surface is connected to the front surface, and
    the sixth surface is situated on the side of the fourth surface,
    wherein rays are incident from the first surface,
    the rays being incident from the first surface are reflected on the fifth surface and the sixth surface,
    the rays being reflected on the fifth surface are reflected on the second surface,
    a portion of the rays being reflected on the second surface are reflected on the third surface,
    a portion of the rays being reflected on the second surface are introduced into the fourth surface,
    the rays being reflected on the sixth surface are reflected on the third surface, and
    the rays being reflected on the third surface are introduced into the fourth surface.

2. The light receiving optical element according to claim 1, wherein the back surface includes a reflection surface subjected to reflection coating, or includes a reflection surface being physically in contact with the back surface.

3. The light receiving optical element according to claim 1, wherein the recessed surface of the front surface includes a reflection surface subjected to reflection coating from the first singular point to the closest point, or includes a reflection surface being physically in contact with the recessed surface.

4. The light receiving optical element according to claim 1, wherein a through hole is provided from the front surface to the back surface.

5. The light receiving optical element according to claim 1, wherein a first point is taken in the fourth surface,
a distance of a line connecting the first point and the first singular point is a first distance,
a point having a distance from the first point larger than the first distance is a second point in the recessed surface, and
an angle $\theta_1$ made by a normal line in the second point and a line from the second point to the first point satisfies an (expression 1):

$$\theta_1 \geq \sin^{-1}\left(\frac{1}{n}\right), \quad \text{(Expression 1)}$$

where the refractive index of the optical element is n.

6. The light receiving optical element according to claim 5, wherein a first point is taken in the fourth surface,
a distance of a line connecting the first point and the first singular point is a first distance,
a point having a distance from the first point smaller than the first distance is a third point in the recessed surface, and
an angle $\theta_2$ made by a normal line in the third point and a line from the third point to the first point satisfies an (expression 2):

$$\theta_2 < \sin^{-1}\left(\frac{1}{n}\right), \quad \text{(Expression 2)}$$

where the refractive index of the optical element is n.

7. The light receiving optical element according to claim 1, wherein an orthogonal point is included in the fourth surface, and
the orthogonal point is a point that a perpendicular line from the first singular point to the fourth surface and the fourth surface cross each other at a right angle.

8. The light receiving optical element according to claim 1, wherein, among normal lines in points on the recessed surface,
a normal line that becomes parallel to the fourth surface exists.

9. The light receiving optical element according to claim 1, wherein a plane is included in the front surface.

10. The light receiving optical element according to claim 6, wherein a fourth point is taken in the recessed surface,
a normal line in the fourth point is perpendicular to the fourth surface, and
an angle $\theta_3$ made by a line connecting the fourth point and the second singular point, and the normal line in the fourth point satisfies an (expression 3):

$$\theta_3 \geq \sin^{-1}\left(\frac{1}{n}\right), \quad \text{(Expression 3)}$$

where the refractive index of the optical element is n.

11. The light receiving optical element according to claim 1, wherein a rotational symmetry axis is included in a center of the optical element, and
the optical element is rotationally symmetrical to the rotational symmetry axis.

12. The light receiving optical element according to claim 10, wherein a rotational symmetry axis is included in a center of the optical element, and
the optical element is rotationally symmetrical to the rotational symmetry axis,
wherein, in a cross section including the rotational symmetry axis,
angles $\theta_4$ made by normal lines in all continuous points on the recessed surface connecting the first singular point and the fourth point, and lines connecting the continuous points and the first point satisfy an (expression 4):

$$\theta_4 = \sin^{-1}\left(\frac{1}{n}\right), \quad \text{(Expression 4)}$$

where the refractive index of the optical element is n.

13. The light receiving optical element according to claim 1, further comprising:
a heat transfer body including a surface being in contact with the recessed surface of the optical element,
wherein the heat transfer body and the optical element are connected on the recessed surface.

14. The light receiving optical element according to claim 1, further comprising a light receiving element connecting to the fourth surface.

15. A light emitting optical element made of a material transparent to light, the optical element comprising:
a front surface having a first surface, a second surface and a third surface;
a back surface facing the front surface; and
a fourth surface connecting to the third surface,
wherein the front surface includes a recessed surface in a region facing the fourth surface,
the recessed surface includes the second surface and the third surface,
the recessed surface has a point closest to the fourth surface as a closest point, and has a first singular point being a discontinuous slope point other than the closest point,
the second surface is situated between the first surface and the third surface,
the first singular point is a boundary point between the second surface and the third surface,
the back surface has a fifth surface and a sixth surface,
a second singular point being a discontinuous slope point is included in the back surface,
the second singular point is a boundary point between the fifth surface and the sixth surface,
the fifth surface is connected to the front surface, and
the sixth surface is situated at the side of the fourth surface, and
wherein rays are incident from the fourth surface,
the rays being incident from the fourth surface are reflected on the second surface and the third surface,
a portion of the rays being reflected on the third surface are reflected on the second surface,
a portion of the rays being reflected on the third surface are reflected on the sixth surface,
the rays being reflected on the second surface are reflected on the fifth surface, and the rays being reflected on the fifth surface and the sixth surface are emitted from the first surface.

16. The light emitting optical element according to claim 15, wherein the back surface includes a reflection surface subjected to reflection coating, or includes a reflection surface being physically in contact with the back surface.

17. The light emitting optical element according to claim 15, wherein the recessed surface of the front surface includes a reflection surface subjected to reflection coating from the first singular point to the closest point, or includes a reflection surface being physically in contact with the recessed surface.

18. The light emitting optical element according to claim 15, wherein a through hole is provided from the front surface to the back surface.

19. The light emitting optical element according to claim 15, wherein a first point is taken in the fourth surface,
a distance of a line connecting the first point and the first singular point is a first distance,
a point having a distance from the first point larger than the first distance is a second point in the recessed surface, and
an angle $\theta_1$ made by a normal line in the second point and a line from the second point to the first point satisfies an (expression 1):

$$\theta_1 \geq \sin^{-1}\left(\frac{1}{n}\right), \quad \text{(Expression 1)}$$

where the refractive index of the optical element is n.

20. The light emitting optical element according to claim 19, wherein a first point is taken in the fourth surface,
a distance of a line connecting the first point and the first singular point is a first distance,
a point having a distance from the first point smaller than the first distance is a third point in the recessed surface, and
an angle $\theta_2$ made by a normal line in the third point and a line from the third point to the first point satisfies an (expression 2):

$$\theta_2 < \sin^{-1}\left(\frac{1}{n}\right), \quad \text{(Expression 2)}$$

where the refractive index of the optical element is n.

21. The light emitting optical element according to claim 15, wherein an orthogonal point is included in the fourth surface, and
the orthogonal point is a point that a perpendicular line from the first singular point to the fourth surface and the fourth surface cross each other at right angle.

22. The light emitting optical element according to claim 15, wherein, among normal lines in points on the recessed surface,
a normal line that becomes parallel to the fourth surface exists.

23. The light emitting optical element according to claim 15, wherein a plane is included in the front surface.

24. The light emitting optical element according to claim 20, wherein a fourth point is taken in the recessed surface,
a normal line in the fourth point is perpendicular to the fourth surface, and
an angle $\theta_3$ made by a line connecting the fourth point and the second singular point, and the normal line in the fourth point satisfies an (expression 3):

$$\theta_3 \geq \sin^{-1}\left(\frac{1}{n}\right), \quad \text{(Expression 3)}$$

where the refractive index of the optical element is n.

25. The light emitting optical element according to claim 15, wherein a rotational symmetry axis is included in a center of the optical element, and
the optical element is rotationally symmetrical to the rotational symmetry axis.

26. The light emitting optical element according to claim 24, wherein a rotational symmetry axis is included in a center of the optical element, and
the optical element is rotationally symmetrical to the rotational symmetry axis,
wherein, in a cross section including the rotational symmetry axis,
angles $\theta_4$ made by normal lines in all continuous points on the recessed surface connecting the first singular point and the fourth point, and lines connecting the continuous points and the first point satisfy an (expression 4):

$$\theta_4 = \sin^{-1}\left(\frac{1}{n}\right), \quad \text{(Expression 4)}$$

where the refractive index of the optical element is n.

27. The light emitting optical element according to claim 15, further comprising:
a heat transfer body including a surface being in contact with the recessed surface of the optical element,
wherein the heat transfer body and the optical element are connected on the recessed surface.

28. The light emitting optical element according to claim 15, further comprising a light emitting element connecting to the fourth surface.

* * * * *